(12) United States Patent
Wang et al.

(10) Patent No.: US 11,637,043 B2
(45) Date of Patent: Apr. 25, 2023

(54) ANALYZING IN-PLANE DISTORTION

(71) Applicant: Applied Materials, Inc., Santa Clara, CA (US)

(72) Inventors: Wenjiao Wang, San Jose, CA (US); Joshua Maher, Sunnyvale, CA (US); Xinhai Han, Santa Clara, CA (US); Deenesh Padhi, Sunnyvale, CA (US); Tza-Jing Gung, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 28 days.

(21) Appl. No.: 17/087,976

(22) Filed: Nov. 3, 2020

(65) Prior Publication Data
US 2022/0138396 A1    May 5, 2022

(51) Int. Cl.
*H01L 21/66* (2006.01)
*G06F 30/398* (2020.01)
*G03F 7/20* (2006.01)

(52) U.S. Cl.
CPC ............ *H01L 22/12* (2013.01); *G06F 30/398* (2020.01); *G03F 7/705* (2013.01)

(58) Field of Classification Search
CPC ... H01L 22/12; H01L 122/20; G03F 7/70633; G03F 30/398; G03F 7/705; G05B 19/41875
See application file for complete search history.

(56) References Cited

U.S. PATENT DOCUMENTS

| | | | | |
|---|---|---|---|---|
| 6,424,879 B1 * | 7/2002 | Chilese | ........... | B82Y 40/00 |
| | | | | 700/121 |
| 7,567,263 B2 * | 7/2009 | Georgiev | ........... | G06T 13/80 |
| | | | | 345/647 |
| 8,509,555 B2 * | 8/2013 | Meany | ........... | H04N 19/1883 |
| | | | | 382/246 |

(Continued)

FOREIGN PATENT DOCUMENTS

| | | | |
|---|---|---|---|
| JP | 2007517239 A | * | 6/2007 |
| WO | 2017011247 A1 | | 1/2017 |

OTHER PUBLICATIONS

PCT Notification of Transmittal Of The International Search Report And The Written Opinion Of The International Searching Authority for PCT Application No. PCT/US2021/057776, dated Mar. 2, 2022, 11 pages.

*Primary Examiner* — Helen Rossoshek
(74) *Attorney, Agent, or Firm* — Lowenstein Sandler LLP

(57) ABSTRACT

Methods, systems, and non-transitory computer readable medium are described for generating assessment maps for corrective action. A method includes receiving a first vector map including a first set of vectors each indicating a distortion of a particular location of a plurality of locations on a substrate. The method further includes generating a second vector map including a second set of vectors by rotating a position of each vector in the first set of vectors. The method further includes generating a third vector map including a third set of vectors based on vectors in the second set of vectors and corresponding vectors in the first set of vectors. The method further includes generating a fourth vector map by subtracting each vector of the third set of vectors from a corresponding vector in the first set of vectors. The fourth vector map indicates a planar component of the first vector map.

15 Claims, 6 Drawing Sheets

(56) References Cited

U.S. PATENT DOCUMENTS

| | | |
|---|---|---|
| 2015/0085979 A1* | 3/2015 | Zheng .................. A61B 6/0492 378/207 |
| 2016/0005662 A1 | 1/2016 | Yieh et al. |
| 2016/0283625 A1 | 9/2016 | Vukkadala et al. |
| 2016/0371423 A1 | 12/2016 | Vukkadala et al. |
| 2018/0173110 A1* | 6/2018 | Hu .......................... G03F 7/705 |
| 2018/0342410 A1 | 11/2018 | Hooge et al. |
| 2020/0117100 A1 | 4/2020 | Corliss et al. |
| 2020/0310127 A1* | 10/2020 | Otsuka ................ G02B 27/0101 |
| 2021/0150665 A1* | 5/2021 | Zhou ..................... G06T 3/0043 |
| 2021/0383820 A1* | 12/2021 | Herre ..................... G10L 25/18 |
| 2022/0003721 A1* | 1/2022 | Aubry ................ G01N 29/4463 |
| 2022/0066456 A1* | 3/2022 | Ebrahimi Afrouzi ........................ A47L 11/4013 |

* cited by examiner

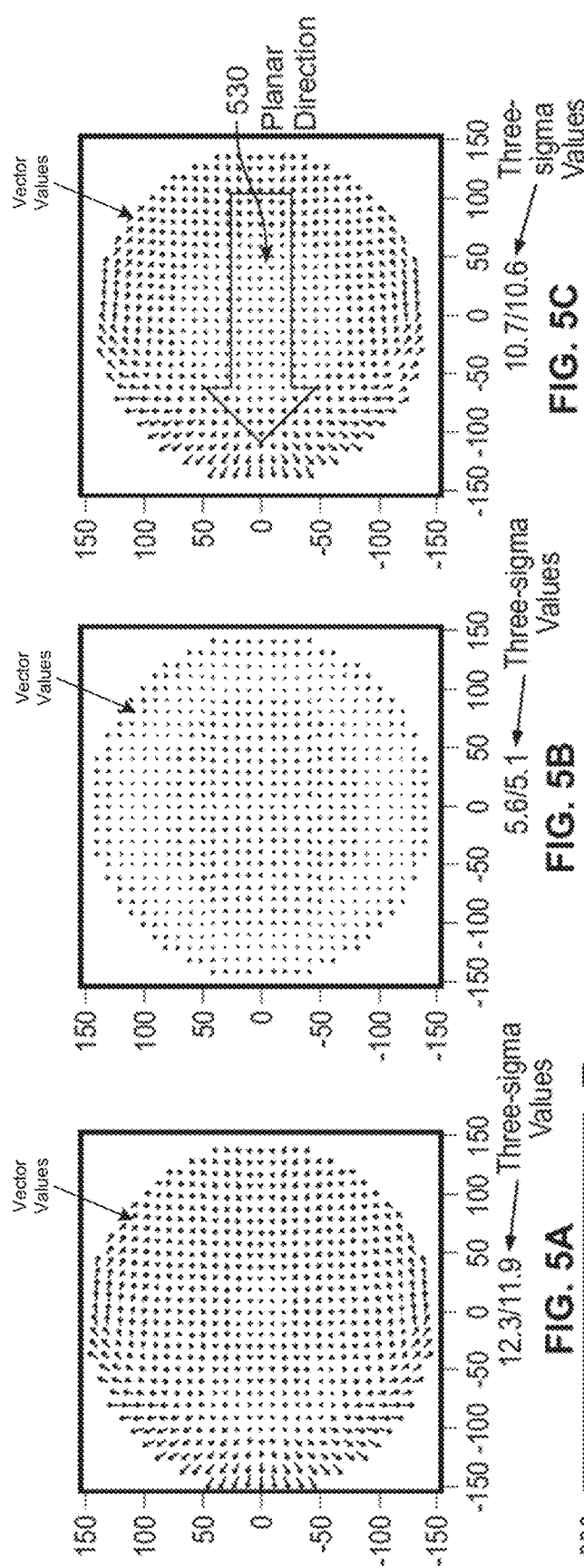
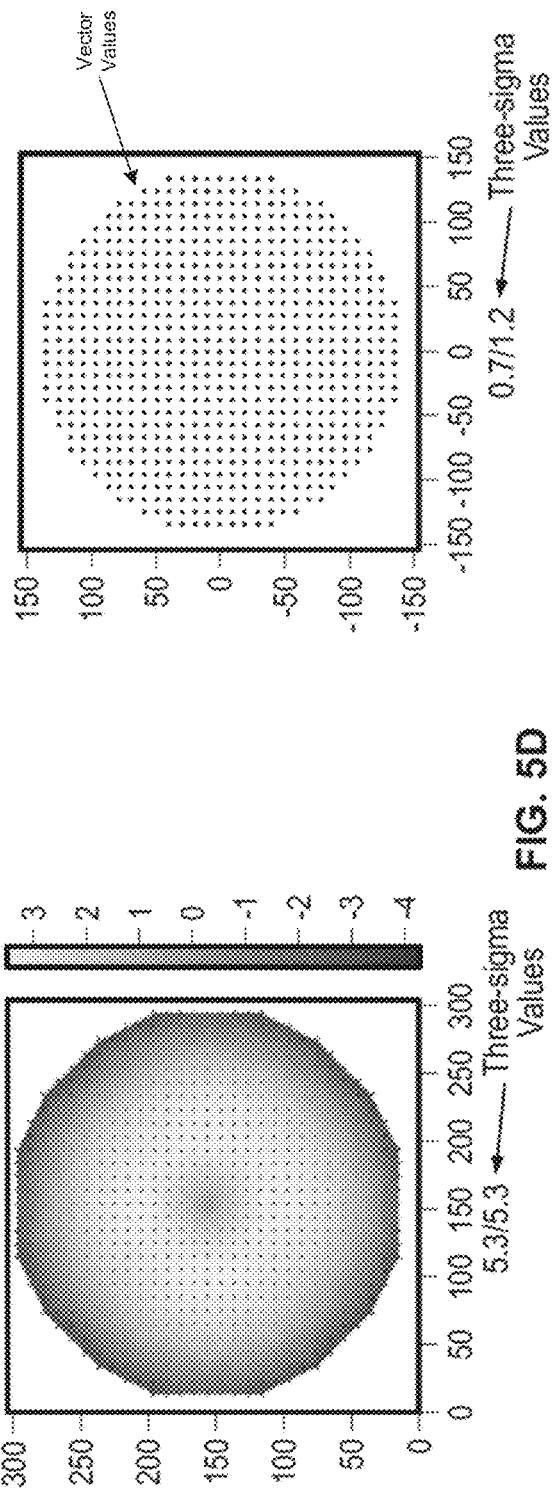
FIG. 5A  
FIG. 5B  
FIG. 5C  
FIG. 5D  
FIG. 5E

ANALYZING IN-PLANE DISTORTION

TECHNICAL FIELD

The present disclosure relates to data integration, and, more particularly, analyzing in-plane distortion.

BACKGROUND

Products may be produced by performing one or more manufacturing processes using manufacturing equipment. For example, semiconductor manufacturing equipment may be used to produce wafers via semiconductor manufacturing processes. Sensors may be used to determine manufacturing parameters of the manufacturing equipment during the manufacturing processes. Metrology equipment may be used to determine property data of the products that were produced by the manufacturing equipment.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, a method may include receiving a first vector map including a first set of vectors, each indicating a distortion of a particular location of a plurality of locations on a substrate. The method further includes generating a second vector map including a second set of vectors by rotating a position of each vector in the first set of vectors. The method further includes generating a third vector map including a third set of vectors based on vectors in the second set of vectors and corresponding vectors in the first set of vectors. The method further includes generating a fourth vector map by subtracting each vector of the third set of vectors from a corresponding vector in the first set of vectors. The fourth vector map indicates a planar component of the first vector map.

In another aspect of the disclosure, a method may include receiving a first vector map including a first set of vectors each indicating a distortion of a particular location of a plurality of locations on a substrate. The method further includes generating a second vector map including a second set of vectors by rotating a position of each vector in the first set of vectors. The method further includes generating a third vector map including a third set of vectors based on vectors in the second set of vectors and corresponding vectors in the first set of vector components. The method further includes generating a fourth vector map including a fourth set of vectors by projecting a direction component of each vector in the third set of vectors to a radial direction. The method may further include generating a fifth vector map having a fifth set of vectors by grouping the vectors of the fourth set of vectors and determining a magnitude associated with each group of vectors. The fifth vector map be a radial map and may indicate at least one of stress or strain exhibited by the substrate.

In another aspect of the disclosure, a method may generate a sixth vector map including a sixth set of vectors by subtracting each vector in the fifth set of vectors from a corresponding vector in the first set of vectors. The sixth vector map may be a residue map and may indicate abnormalities in the substrate.

BRIEF DESCRIPTION OF THE DRAWINGS

The present disclosure is illustrated by way of example, and not by way of limitation in the figures of the accompanying drawings.

FIGS. 5A-5E are graphs illustrating IPD maps and assessment maps, according to certain embodiments.

DETAILED DESCRIPTION

Figure 1:
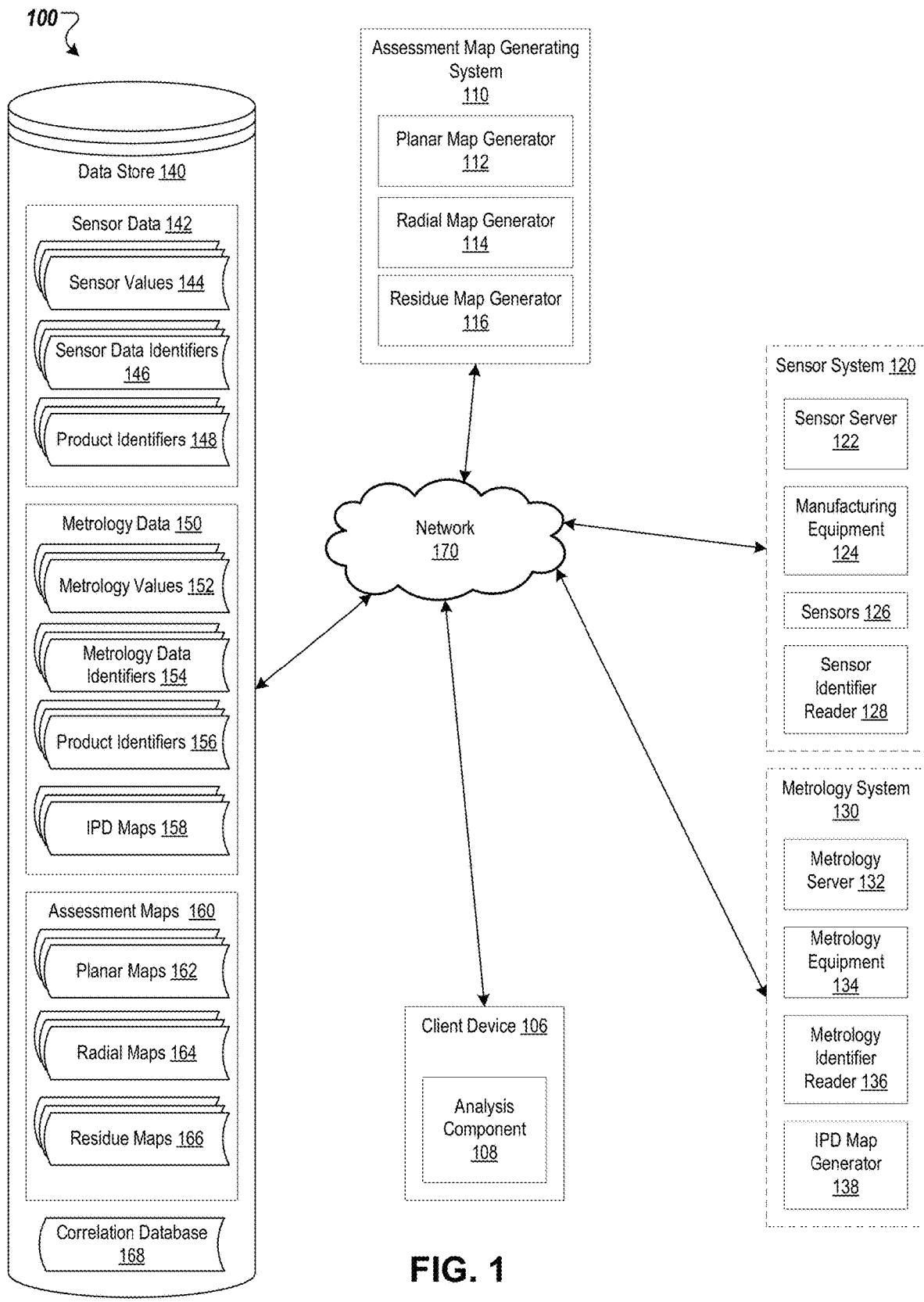
FIG. 1 is a block diagram illustrating an exemplary system architecture, according to certain embodiments.

Described herein are technologies directed to analyzing in-plane distortion. Vertical NAND (V-NAND) or 3D NAND memory typically stacks memory cells vertically, and uses a charge trap flash architecture. To construct, alternating layers of conducting and insulating film are stacked on a wafer substrate. By stacking multiple layers, higher storage density is produced. In order to achieve a high throughout to cut costs, manufacturers typically enable high energy density and gas feed to the reactor. However, as the thickness and number of layers for the stacking film increases, poor energy distribution and uneven gas flow leads to a lack of uniformity in the stacked 3D NAND film. Accordingly, the lack of uniformity leads to a high in-plane distortion (IPD), which may result in the 3D NAND memory experiencing poor performance issues.

IPD may be described by the overlay vector map on the wafer substrate. For locations on the wafer and/or for each logical unit (i.e., die), IPD may include a vector having x-axis component and a y-axis component. The vector may indicate a magnitude and direction of distortion at a location on the wafer. Distortion may occur due to the incorrect energy distribution, gas flow non-uniformity, hardware issues, design issues, or other problems that may occur during a manufacturing process. The non-uniformity of an overlay vector distribution may be characterized by its three-sigma value. Three-sigma is a statistical tool used to calculate probability. A three-sigma value may be used as a standard on whether the IPD distribution meets industry requirements (e.g., following lithography steps to attain a good yield). However, the three-sigma value gives limited data regarding which area(s) needs to be improved and/or optimized to lower in-plane distortion. Furthermore, the three-sigma value fails to gauge the effect on IPD uniformity from process or hardware changes.

The devices, systems, and methods disclosed herein use metrology data to generate assessment maps from IPD maps associated with wafer substrates. Specifically, the devices, systems, and methods disclosed herein may analyze and decompose different aspects related to an IPD map. In a first example, the system of the present disclosure may generate a planar map to determine a planar component of the IPD map. A planar component may indicate distortion due to a potential asymmetry of the manufacturing process, either in configuration of the hardware of the manufacturing equipment, or the manufacturing process (e.g., interaction between plasma and gas flow distribution). The planar map may indicate a magnitude of the planar component.

To generate the planar map, the system may first receive a first vector map associated with manufacturing parameters of a substrate. The first vector map may include a first set of vectors each indicating a distortion of a particular location on the substrate. The first vector map may be an IPD map. The system may then generate a second vector map including a second set of vectors by rotating a position of each vector in the first set of vector components. The second set of vectors may each indicate a change in direction of the magnitude of the distortion of the particular location on the substrate. The system may then generate a third vector map including a third set of vectors based on vectors in the second set of vectors and corresponding vectors in the first set of vectors. The third set of vectors may reflect reduced noise in distortions across the locations on the substrate. The system may then generate a fourth vector map by subtracting each vector of the third set of vectors from a corresponding vector in the first set of vectors. The fourth vector map may indicate a planar component of the first vector map.

In another example, the system may generate a radial map to determine a radial component of the IPD map. A radial component may indicate distortion due to tensile and compressive stresses exerted across a wafer. The direction and the three-sigma value of the radial map may gauge what effect the manufacturing process and hardware parts of the manufacturing equipment have on radial IPD of the substrate.

To generate the radial map, the system may receive a first vector map associated with manufacturing parameters of a substrate. The first vector map may include a first set of vectors each indicating a distortion of a particular location of multiple locations on the substrate. The system may then generate a second vector map including a second set of vectors by rotating a position of each vector in the first set of vectors. The second set of vectors may each indicate a change in direction of the magnitude of the distortion of the particular location on the substrate. The system may further generate a third vector map including a third set of vectors based on vectors in the second set of vectors and corresponding vectors in the first set of vectors. The third set of vectors may reflect reduced noise in distortions across the plurality of locations on the substrate. The system may further generate a fourth vector map including a fourth set of vectors by projecting a direction component of each vector in the third set of vectors to a radial direction. The system may further generate a fifth vector map including a fifth set of vector components by grouping the vectors of the fourth set of vectors and determining a magnitude associated with each group of vectors. The fifth vector map include the radial map, and may indicate stresses and/or strains exhibited by the substrate.

In another example, the system may generate a residue map to determine a residue component of the IPD map. A residue component may indicate localized defects caused by a hardware failure, a process instability, a hardware design flaw, etc. To generate the residue map, the system may generate a sixth vector map, including a sixth set of vectors, by subtracting each vector in the fifth set of vectors from a corresponding vector in the first set of vectors.

Aspects of the present disclosure result in technological advantages of significant reduction in energy consumption, product defects, performance issues, processor overhead, and so forth. In some embodiments, the technological advantages result from generating assessment maps for each wafer produced by manufacturing equipment. The assessment maps may include planar maps that detail planar components of an IPD map, radial maps that detail radial components of the IPD map, and residue maps that detail residue components of the IPD map. The assessment maps may allow a user or a system to determine manufacturing hardware and process issues that can lead to a defective or poor product. Furthermore, the assessment maps may allow a user or the system to determine how to optimize or improve the manufacturing process, thus resulting in less energy consumption, less defective products, and an improved IPD when compared to conventional approaches.

FIG. 1 is a block diagram illustrating an exemplary system architecture 100, according to certain embodiments. The system architecture 100 includes a client device 106, an assessment map generating system 110, a sensor system 120, a metrology system 130, and a data store 140. The assessment map generating system 110 may include a planar map generator 112 that generates planar maps 162, a radial map generator 114 that generates radial maps 164, and a residue map generator 116 that generates residue maps 166. The sensor system may 120 include a sensor server 122 (e.g., field service server (FSS) at a manufacturing facility), manufacturing equipment 124, sensors 126, and sensor identifier reader 128 (e.g., front opening unified pod (FOUP) radio frequency identification (RFID) reader for sensor system 120). The metrology system 130 may include a metrology server 132 (e.g., metrology database, metrology folders, etc.), metrology equipment 134, metrology identifier reader 136 (e.g., FOUP RFID reader for metrology system 130), and an in-plane distortion map generator 138.

The sensors 126 may provide sensor values 144 (e.g., manufacturing parameters) associated with producing corresponding product (e.g., substrates or wafers) by manufacturing equipment 124. The sensor values 144 may include a value of one or more of temperature (e.g., heater temperature), spacing (SP), pressure, high frequency radio frequency (HFRF), voltage of electrostatic chuck (ESC), electrical current, flow, power, voltage, plasma and/or gas flow, energy distribution, etc. Sensor values 144 may be associated with or indicative of manufacturing parameters such as hardware parameters (e.g., settings or components (e.g., size, type, etc.) of the manufacturing equipment 124) or process parameters (e.g., flow rates) of the manufacturing equipment. The sensor values 144 may be provided while the manufacturing equipment 124 is performing manufacturing processes (e.g., equipment readings when processing wafers). The sensor values 144 may be different for each product (e.g., each wafer).

The sensor identifier reader 128 (e.g., FOUP RFID reader for sensor system 120) may provide a sensor carrier identifier (e.g., FOUP identifier, wafer carrier identifier, slot identifier, etc.). The sensor server 122 may generate a sensor data identifier 146 that includes the sensor carrier identifier and a timestamp (e.g., date, time, etc.). A sensor carrier identifier may be a carrier identifier (e.g., FOUP identifier, etc.) identified by the sensor system 120 (e.g., via sensor identifier reader 128). The sensor server 122 may generate sensor data 142 that includes sensor values 144 and a sensor data identifier 146. In some embodiments, the sensor data 142 (e.g., sensor data identifiers 146) further includes product identifiers 148. For example, multiple products (e.g., twenty-five wafers) may be associated with the same sensor carrier identifier and each product identifier 148 may indicate the order of the products (e.g., first wafer, second wafer, etc. in the wafer carrier).

The metrology equipment 134 may provide metrology values 152 (e.g., property data of wafers) associated with products (e.g., wafers) produced by the manufacturing equipment 124. The metrology values 152 may include a value of one or more of film property data (e.g., wafer spatial film properties), dimensions (e.g., thickness, height, etc.), in-plane distortions and/or uniformity, dielectric constant, dopant concentration, density, defects, etc. The metrology values 152 may be of a finished or semi-finished product. The metrology values 152 may be different for each product (e.g., each wafer).

The metrology identifier reader 136 (e.g., FOUP RFID reader for metrology system 130) may provide a metrology carrier identifier (e.g., FOUP identifier, wafer carrier identifier, slot identifier, etc.). A metrology carrier identifier may be a carrier identifier (e.g., FOUP identifier, etc.) identified by the metrology system 130 (e.g., via metrology identifier reader 136). The metrology carrier identifier and the sensor carrier identifier that correspond to the same products (e.g., same wafers) may be the same carrier identifier (e.g., same FOUP ID) and correspond to the same carrier (e.g., the same FOUP). The metrology server 132 may generate metrology data identifiers 154 that include the metrology carrier identifier and a timestamp (e.g., date stamp, etc.). The metrology server 132 may generate metrology data 150 that includes metrology values 152 and a metrology data identifier 154. In some embodiments, the metrology data 150 further includes product identifiers 156. For example, multiple products (e.g., twenty-five wafers) may be associated with the same metrology data identifier 154 (e.g., wafer carrier identifier) and each product identifier 156 may indicate the order of the products (e.g., first wafer, second wafer, etc. in the wafer carrier).

In some embodiments, a product carrier (e.g., FOUP, wafer carrier) may transfer the products from the manufacturing equipment 124 to the metrology equipment 134. The products may maintain the same order (e.g., same location in the FOUP or wafer carrier) in the sensor system 120 and in the metrology system 130. For example, wafers may be loaded into and out of the manufacturing equipment 124 (e.g., for processing of the wafers and providing sensor data 142 via sensor server 122) in the same order as they are loaded into and out of metrology equipment 134 (e.g., for providing metrology data 150 via metrology system 130). In some embodiments, the sensor carrier identifier (e.g., FOUP ID associated with sensor system 120) and the metrology carrier identifier (e.g., FOUP ID associated with metrology system 130) that correspond to the same products are associated with the same product carrier (e.g., the same FOUP) and/or carrier identifier (e.g., the sensor carrier identifier and the metrology carrier identifier are the same).

The IPD map generator 138 may generate an IPD map 158 from the metrology values 152. The IPD map 158 may be an overlay vector map that includes distortion vectors at each of multiple locations on a wafer, and coordinates of die on the wafer. Each vector on the vector map may include an x-axis component and a y-axis component. Each wafer produced by the manufacturing equipment 124 may have an IPD map 158 generated based on its metrology values 152. Each vector may be associated with a location on the wafer, or with a die (e.g., logical unit) on the wafer. FIG. 5A is a graph showing an example IPD map. Specifically, FIG. 5A shows an IPD map with vectors at multiple location, measured in nanometers. Each IPD map 158 may include a three-sigma value for the x-axis components and the y-axis components.

Three-sigma is a statistical tool used to calculate probability. The IPD map generator 138 can determine a three-sigma value for the x-axis components by first calculating the standard deviation of the x-axis components and for the y-axis components by first calculating standard deviation of the y-axis components on an IPD map. Each standard deviation may be multiplied by 3, and the product of the multiplication may be subtracted from a mean value (a mean value of x-axis components and a mean value of y-axis components). The resultant three-sigma value indicates a high (e.g., 99.73%) chance that other vectors will have a value (e.g., a magnitude) lower than the three-sigma value. As shown in FIG. 5A, the three-sigma value for the x-axis components is 12.3 nanometers and the three-sigma value for the y-axis components is 11.9 nanometers. Three-sigma values may be determined for every type of vector map. For example, the planar map generator 112 may determine three-sigma values for the planar maps 162, the radial map generator 114 may determine three-sigma values for the radial maps 164, and the residue map generator 116 may determine three-sigma values for the residue maps 166. Additionally, three-sigma value may be determined, by the assessment map generating system 110 for intermediate vector maps generated during the process of generating the planar maps 162, the radial maps 164, and the residue maps 166. The will be explained in greater detail below.

Returning to FIG. 1, the client device 106, assessment map generating system 110, sensor system 120 (e.g., sensor server 122, manufacturing equipment 124, sensors 126, sensor identifier reader 128, etc.), metrology system 130 (e.g., metrology server 132, metrology equipment 134, metrology identifier reader 136, IPD map generator, etc.), and data store 140 may be coupled to each other via a network 170 for generating planar maps 162, radial maps 164, and residue maps 166 to perform corrective actions by analysis component 108. The corrective action may be based on data from correlation database 168. The correlation database 168 may associate one or more types of deformations or flaws identified from one or more of the IPD map 158, the planar map 162, the radial map 164, and/or the residue map to one or more causes of the deformation and/or flaw.

In some embodiments, network 170 is a public network that provides client device 106 with access to the assessment map generating system 110, data store 140, and other publically available computing devices. In some embodiments, network 170 is a private network that provides assessment map generating system 110 access to the sensor system 120, metrology system 130, data store 140, and other privately available computing devices and that provides client device 106 access to the map generating system 110, data store 140, and other privately available computing devices. Network 170 may include one or more wide area networks (WANs), local area networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

The client device 106 may include a computing device such as personal computers (PCs), laptops, mobile phones, smart phones, tablet computers, netbook computers, network connected televisions ("smart TV"), network-connected media players (e.g., Blu-ray player), a set-top-box, over-the-top (OTT) streaming devices, operator boxes, etc. The client device 106 may be capable of obtaining metrology data (from data store 140, from metrology system 130, etc.) associated with product (e.g., substrates, wafers, die, etc.), produced by the manufacturing equipment 124, receiving user input requesting one or more assessment maps 160 to be generated by the assessment map generating system 110, receiving the requested assessment maps, obtaining sensor data associated with the manufacturing equipment 124 (e.g., from data store 140, from sensor system 120, etc.), and causing a corrective action (e.g., adjustment in the manufacturing parameters of the manufacturing equipment 124) based on the assessment maps. Each client device 106 may include an operating system that allows users to one or more of generate, view, or edit data (e.g., indication associated with manufacturing equipment 124, corrective actions associated with manufacturing equipment 124, etc.). In some embodiments, the metrology data 150 corresponds to historical property data of products (e.g., produced using manufacturing parameters associated with sensor data 142).

Performing manufacturing processes the result in defective products can be costly in time, energy, and manufacturing equipment 124 used to make the defective products, the cost of identifying the defects and discarding the defective product, etc. By inputting current sensor data and/or metrology data, receiving output of assessment maps 160, and performing a corrective action based on the assessment maps 160, system 100 can have the technical advantage of avoiding the cost of producing, identifying, and discarding defective products.

Manufacturing parameters may be suboptimal for producing products which may have costly results of increased resource (e.g., energy, coolant, gases, etc.) consumption, increased amount of time to produce the products, increased component failure, increased amounts of defective products, etc. By generating assessment maps 160 and analyzing the results (e.g., planarity, deformations, stresses, strains, abnormalities, etc.) indicated in the assessment maps 160, and adjusting the manufacturing parameters of the manufacturing equipment 124, system 100 can have a technical advantage of using optimal manufacturing parameters (e.g., hardware parameters, process parameters, optimal design) to avoid costly results of suboptimal manufacturing parameters Corrective action may be associated with one or more of computational process control (CPC), statistical process control (SPC), automatic process control (APC), preventative operative maintenance, design optimization, updating of manufacturing parameters, feedback control, machine learning modification, replacing or repairing a manufacturing component, etc.

Sensor data 142 may be associated with manufacturing processes of manufacturing equipment 124 and metrology data 150 may be associated with properties of the finished product produced by the manufacturing processes. In another example, the manufacturing equipment may be a film material dispenser and the manufacturing process may be dispensing a layer of film onto a wafer. The sensor data 142 may indicate gas flow distribution, flow rate, etc. The metrology data 150 may indicate a film thickness, distortion, etc. The metrology data 150 may further indicate in-plane distortions on an IPD map (e.g., IPD maps 158).

The assessment map generating component 110 may use the IPD maps 158 to generate assessment maps 160. The assessment maps 160 may assess an IPD map and indicate deformation properties of the IPD map. For example, the assessment map generating component 110 may generate one or more planar map 162, one or more radial maps 164, and one or more residue maps 166. The planar map may indicate a direction of a planarity of the wafer. Specifically, the planar map may indicate a direction of a sloping effect produced by the stacked film on the wafer. The radial map indicate stress and/or strains across the wafer (e.g., compressive stresses, tensile stresses, etc.). The residue map may indicate abnormalities on the wafer. Each of the assessment maps 160 may include a three-sigma value. The three-sigma value, the magnitude, and/or the direction of the vectors on each of the assessment maps 160 may indicate the severity of distortion, stress, abnormalities, etc. Based on the assessment maps 160, the client device 106 (e.g., via the analysis component 108) may recommend corrective action or cause the corrective action to be performed, either from user input or automatically.

Manufacturing parameters may include hardware parameters (e.g., replacing components, using certain components, etc.) and/or process parameters (e.g., temperature, pressure, flow, rate, etc.). In some embodiments, the corrective action is causing preventative operative maintenance (e.g., replace, process, clean, etc. components of the manufacturing equipment 124). In some embodiments, the corrective action is causing design optimization (e.g., updating manufacturing parameters, manufacturing processes, manufacturing equipment 124, etc. for an optimized product). In an example, based on vector magnitudes, vector directions, and/or the three-sigma value (when compared to a threshold value) of the planar map, hardware configuration issues or an unfavorable interaction between plasma and gas flow distribution may be indicated. In another example, based on vector magnitudes, directions, and/or the three-sigma value of the radial map, energy distribution and gas flow issues can be indicated. In yet another example, based on vector magnitudes, directions, and/or the three-sigma values of the residue map, hardware design flaws (e.g., an arching spot on an electrode) can be indicated.

The client device 106 may include an analysis component 108. Analysis component 108 may receive user input (e.g., via a GUI displayed via the client device 106) of a request for assessment maps. In some embodiments, the analysis component 108 transmits the request to the assessment map generating system 110, receives output (e.g., assessment maps 160) from the assessment map generating system 110, and displays the assessment maps 160 for analysis. In some embodiments, the analysis component 108 determines a corrective action based on the output. In some embodiments, the analysis component 108 causes the corrective action to be implemented (e.g., changing a manufacturing parameter) automatically, or upon receiving user input.

Sensor server 122 and metrology server 132 may each include one or more computing devices such as a rackmount server, a router computer, a server computer, a personal computer, a mainframe computer, a laptop computer, a tablet computer, a desktop computer, graphics processing unit (GPU), accelerator application-specific integrated circuit (ASIC) (e.g., tensor processing unit (TPU)), etc.

Data store 140 may be a memory (e.g., random access memory), a drive (e.g., a hard drive, a flash drive), a database system, or another type of component or device capable of storing data. Data store 140 may include multiple storage components (e.g., multiple drives or multiple databases) that may span multiple computing devices (e.g., multiple server computers). The data store 140 may store sensor data 142, metrology data 150, and assessment maps 160.

Sensor data 142 may include sensor values, sensor data identifiers 146, and product identifiers 148. Metrology data 150 may include metrology values 152, metrology data identifiers 154, product identifiers 156, and IPD maps 158. Each instance (e.g., set) of sensor data 142 may correspond to a corresponding product carrier (e.g., associated with a sensor data identifier 146), a corresponding timestamp (e.g., associated with the sensor data identifier 146), and/or a corresponding product (e.g., associated with a product identifier 148). Each instance (e.g., set) of metrology data 150 may correspond to a corresponding product carrier (e.g., associated with a metrology data identifier 154), a corresponding timestamp (e.g., associated with the metrology data identifier 154), and/or a corresponding product (e.g., associated with a product identifier 156).

In some embodiments, the functions of client device 106, assessment map generating system 110, sensor server 122, metrology server 132, may be provided by a fewer number of machines. In some embodiments, assessment map generating system 110, sensor server 122, and metrology server 132, may be integrated into a single machine.

It should be noted that functions described in one embodiment as being performed by client device 106, sensor server 122, metrology server 132, can also be performed on the assessment map generating system 110 in other embodiments, if appropriate. In addition, the functionality attributed to a particular component can be performed by different or multiple components operating together. The assessment map generating system 110 may be accessed as a service provided to other systems or devices through appropriate application programming interfaces (API).

In embodiments, a "user" may be represented as a single individual. However, other embodiments of the disclosure encompass a "user" being an entity controlled by a plurality of users and/or an automated source. For example, a set of individual users federated as a group of administrators may be considered a "user."

Although embodiments of the disclosure are discussed in terms of generating assessment maps 160 to perform a corrective action in manufacturing facilities (e.g., semiconductor manufacturing facilities), embodiments may also be generally applied to aggregating types of data to perform an action. Embodiments may be generally applied to integrating different types of data. For example, sensor data may be aggregated with corresponding component failure data for predicting end of life of components. In another example, images may be aggregated with corresponding image classification for predicting image classification of images.

Figure 2:
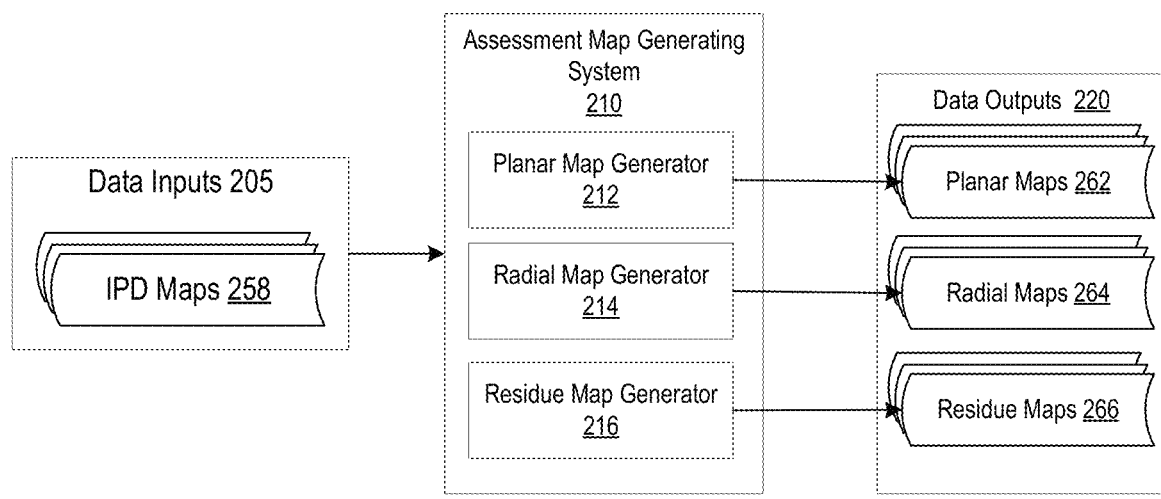
FIG. 2 is a block diagram illustrating generation of assessment maps, according to certain embodiments.

FIG. 2 is a block diagram illustrating a system 200 for generating assessment maps (e.g., assessment maps 160 of FIG. 1) using IPD maps 258 (e.g., IPD maps 158 of FIG. 1), according to certain embodiments. The system of FIG. 2 shows data inputs 205, assessment map generating system 210, and data outputs 220.

In some embodiments, the assessment map generating system 210 may receive one or more data inputs 205 (e.g., one or more IPD maps 258). The one or more data inputs 205 may be sent to the assessment map generating system 210 automatically, or by user input (e.g., a request). In some embodiments, the planar map generator 212 (e.g., planar map generator 112 of FIG. 1) may generate one or more planar maps 262. The process of generating a planar map will be discussed in greater detail in FIG. 3. In some embodiments, the radial map generator 214 (e.g., radial map generator 114 of FIG. 1) may generate one or more radial maps 264. The process of generating a radial map will be discussed in greater detail in FIG. 4. In some embodiments, the residue map generator 216 (e.g., planar map generator 116 of FIG. 1) may generate one or more residue maps 266. The process of generating a residue map will be discussed in greater detail in FIG. 4.

Figure 3:
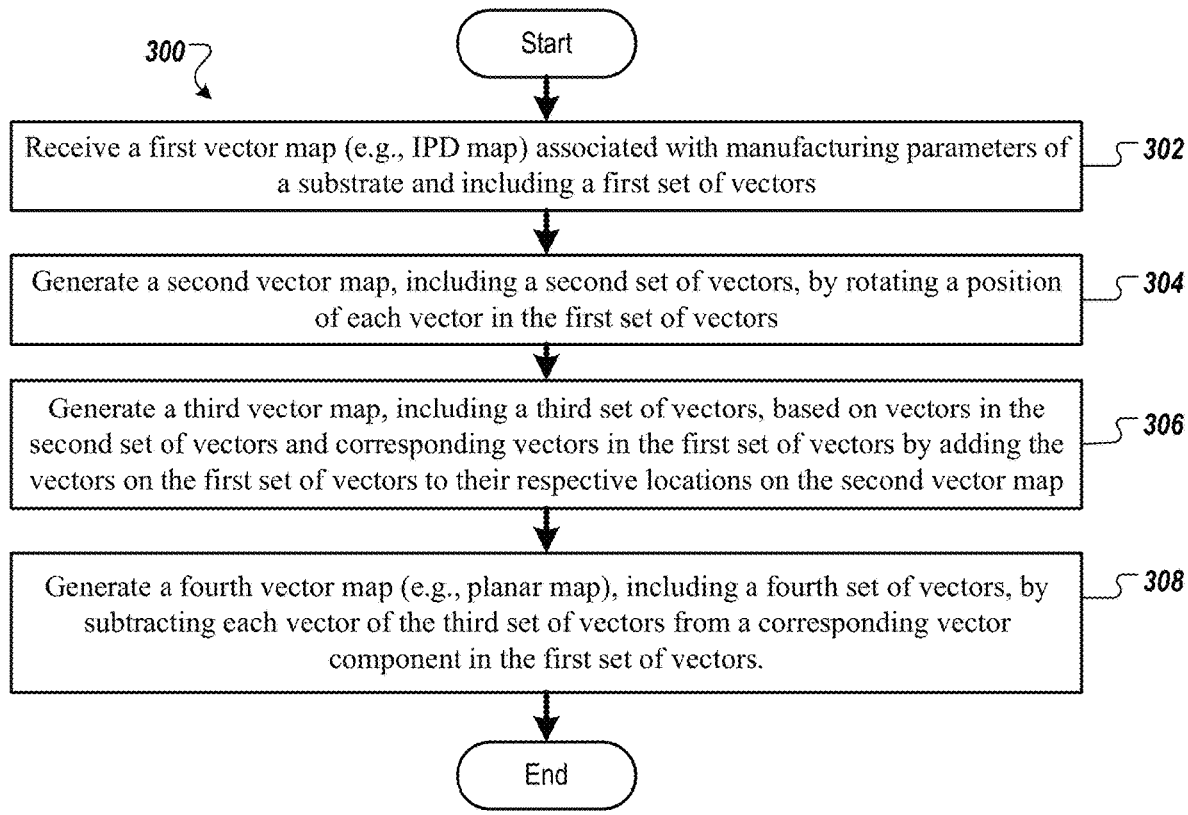
FIG. 3 is a flow diagram of a method of generating planar maps, according to certain embodiments.

FIG. 3 is a flow diagram of a method 300 for generating a planar map (e.g., planar map 162 of FIG. 1), according to certain embodiments. Method 300 may be performed by processing logic that may include hardware (e.g., circuitry, dedicated logic, programmable logic, microcode, processing device, etc.), software (such as instructions run on a processing device, a general purpose computer system, or a dedicated machine), firmware, microcode, or a combination thereof. In one embodiment, method 300 may be performed, in part, by assessment map generating system 110 (e.g., planar map generator 112). In some embodiments, a non-transitory storage medium stores instructions that when executed by a processing device (e.g., of assessment map generating system 110) cause the processing device to perform method 300.

For simplicity of explanation, method 300 is depicted and described as a series of acts. However, acts in accordance with this disclosure can occur in various orders and/or concurrently and with other acts not presented and described herein. Furthermore, not all illustrated acts may be performed to implement the method 300 in accordance with the disclosed subject matter. In addition, those skilled in the art will understand and appreciate that the method 300 could alternatively be represented as a series of interrelated states via a state diagram or events.

Due to a potential asymmetry of the manufacturing process, either in configuration of the hardware of the manufacturing equipment 124, or the manufacturing process (e.g., interaction between plasma and gas flow distribution), an IPD map may have a planar component, which can cause a high in-plane distortion. The operations of method 300 generate a planar map, which indicates a magnitude of the planar component.

Referring to FIG. 3, at block 302, the processing logic receives a first vector map associated with manufacturing parameters of a substrate (e.g., wafer). The first vector map may be an IPD map (e.g., IPD map 158) and will be referred to as an IPD map, hereafter. The IPD map may include a first set of vectors where each vector indicates a distortion of a particular location on the wafer. Each vector of the IPD map may have an x-axis component and a y-axis component indicating direction and magnitude. The IPD map may be created using metrology data from the metrology system 130, and stored in a data store (e.g., data store 140 of FIG. 1), and the processing logic may obtain (e.g., retrieve) the IPD may from the data store. In an example, the IPD map may be calculated based on the changes of surface slopes of the substrate.

At block 304, the processing logic generates a second vector map including a second set of vectors. The processing logic may generate the second vector map by rotating a position of each vector in the first set of vectors. In an example, each vector in the second set of vectors is rotated by approximately or exactly 180 degrees. The second set of vectors may each indicate a change in direction of the magnitude of a distortion at a particular location on the substrate. The second vector map may be stored in a cache or memory component of the assessment map generating system 110, or in the data store 140. The second vector map may be stored temporarily while method 300 is performed, or permanently.

At block 306, the processing logic generates a third vector map including a third set of vectors. The third set of vectors may be based on vectors in the second set of vectors and corresponding vectors in the first set of vectors. In an example, the processing logic generates the third vector map by adding the vectors on the first set of vectors to their respective locations on the second vector map. The sum at each location may then be divided by 2 to generate the third set of vectors. The third set of vectors may reflect reduced noise in distortions across the locations on the substrate. The processing logic may generate a three-sigma value for the x-axis component and for the y-axis component of the third vector map. FIG. 5B is a graph showing an example of a third vector map, which includes a third set of vectors. The third vector map shown in FIG. 5B is generated by applying the above steps of method 300 to the IPD map shown in FIG. 5A. The three-sigma value for the x-axis of the third vector map in FIG. 5B is 5.6 nm and the three-sigma value for the y-axis component is 5.1 nm.

Returning to FIG. 3, at block 308, the processing logic generates a fourth vector map including a fourth set of vectors. The fourth vector map may be a planar map (e.g., planar map 162) and will be referred to as a planar map, hereafter. In an example, the processing logic generates the planar map by subtracting each vector of the third set of vectors from a corresponding vector component in the first set of vectors. The planar map indicates a planar component of the IPD map. Based on the directions and the magnitudes of the fourth set of vectors, the processing logic may determine a direction of the planar component. The processing logic may generate a three-sigma value for the x-axis component and for the y-axis component of the planar map. FIG. 5C is a graph showing an example of the planar map. The three-sigma value for the x-axis of the graph in FIG. 5C is 10.7 nm and the three-sigma value for the y-axis component is 10.6 nm. The planar direction is indicated by arrow 530. The planar map allows for quantification (e.g., via magnitude and direction) of the effect on planar IPD from hardware components and manufacturing processes. The analysis component 108 may use the correlation database to associate one or more deformed or flawed sections of the planar map with one or more causes (e.g., a configuration of the hardware of the manufacturing equipment, a manufacturing process parameter, such as an interaction between plasma and gas flow distribution, etc.). The analysis component 108 may generate a recommendation based on the planar map. In an example, the analysis component 108 may recommend a design optimization, a manufacturing part replacement, and/or a manufacturing process adjustment to minimize the planar component. In another example, the analysis component 108 may automatically perform a corrective action based on the planar map, such as, for example, adjust the gas flow distribution, perform pedestal heater leveling to correct planar contribution, etc.

Figure 4:
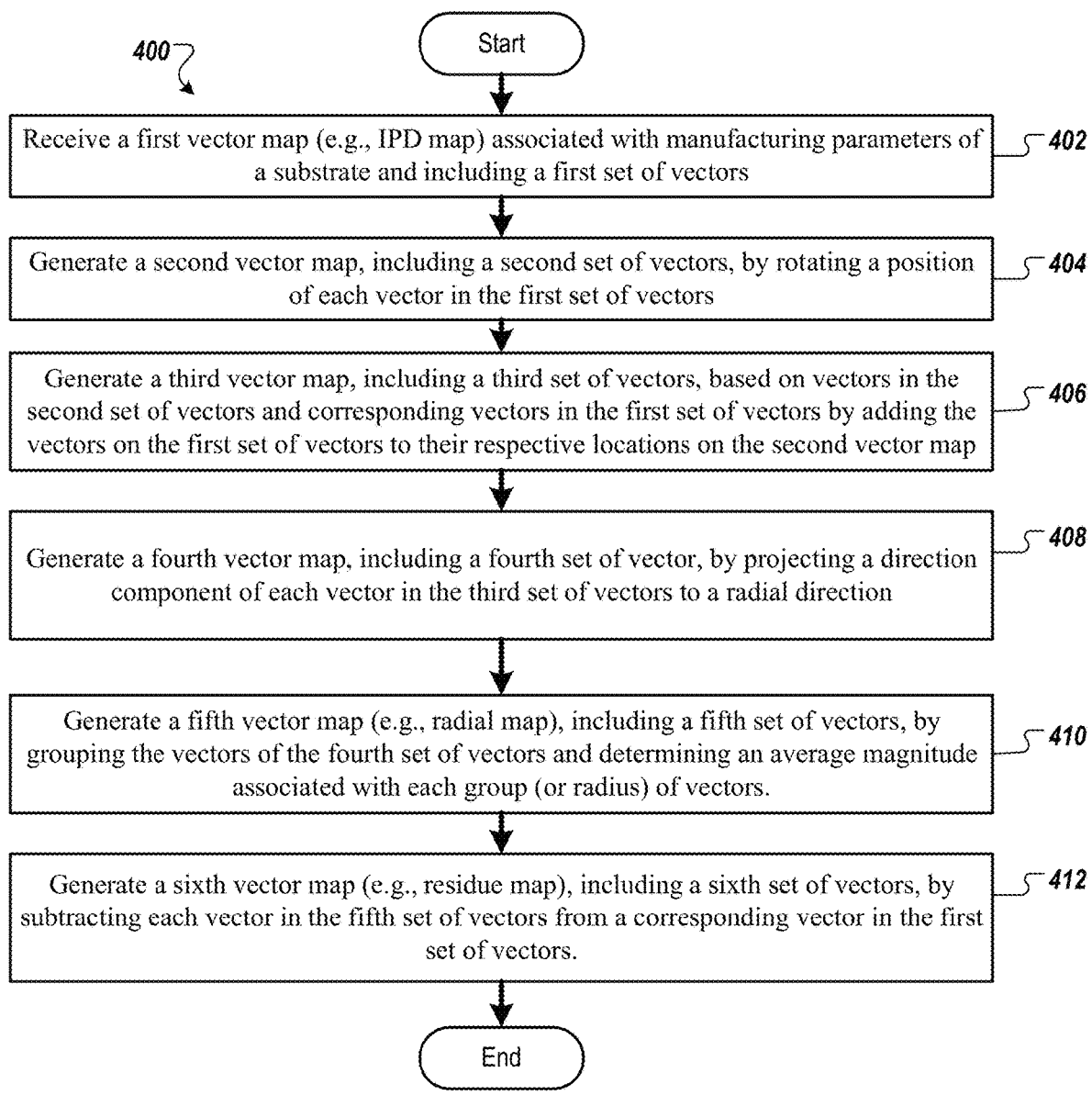
FIG. 4 is a flow diagram of a method of generating radial maps and residue maps, according to certain embodiments.

FIG. 4 is a flow diagram of a method 400 for generating a radial map (e.g., radial map 164 of FIG. 1) and a residue map (e.g., residue map 166 of FIG. 1), according to certain embodiments. Method 400 may be performed by processing logic that may include hardware (e.g., circuitry, dedicated logic, programmable logic, microcode, processing device, etc.), software (such as instructions run on a processing device, a general purpose computer system, or a dedicated machine), firmware, microcode, or a combination thereof. In one embodiment, method 400 may be performed, in part, by assessment map generating system 110 (e.g., radial map generator 114 and/or residue map generator 116). In some embodiments, a non-transitory storage medium stores instructions that when executed by a processing device (e.g., of vector map generating system 110) cause the processing device to perform method 400.

For simplicity of explanation, method 400 is depicted and described as a series of acts. However, acts in accordance with this disclosure can occur in various orders and/or concurrently and with other acts not presented and described herein. Furthermore, not all illustrated acts may be performed to implement the method 400 in accordance with the disclosed subject matter. In addition, those skilled in the art will understand and appreciate that the method 400 could alternatively be represented as a series of interrelated states via a state diagram or events. Portions of method 400 may be the similar or the same as blocks of method 300 of FIG. 3.

Referring to FIG. 4, at block 402, the processing logic receives a first vector map associated with manufacturing parameters of a substrate (e.g., wafer). The first vector map may be an IPD map (e.g., IPD map 158) and will be referred to as an IPD map, hereafter. The IPD map may include a first set of vectors where each vector indicates a distortion of a particular location on the substrate. Each vector may have an x-axis component and a y-axis component. The IPD map may be obtained (e.g., retrieved) from a data store (e.g., data store 140 of FIG. 1).

At block 404, the processing logic generates a second vector map including a second set of vectors. The processing logic may generate the second vector map by rotating a position of each vector in the first set of vectors. In an example, each vector in the second set of vectors is rotated by approximately or exactly 180 degrees. The second set of vectors may each indicate a change in direction of the magnitude of the distortion of the particular location on the substrate. The second vector map may be stored in a cache or memory component of the vector map generating system 110, or in the data store 140. The second vector map may be stored temporarily for use during method 400, or permanently.

At block 406, the processing logic generates a third vector map including a third set of vectors. The third set of vectors may be based on vectors in the second set of vectors and corresponding vectors in the first set of vectors. In an example, the processing logic generates the third vector map by adding the vectors on the first set of vectors to their respective locations on the second vector map. The sum at each location may then be divided by 2 to generate the third set of vectors. The third set of vectors may reflect reduced noise in distortions across the locations on the substrate.

At block 408, the processing logic generates a fourth vector map including a fourth set of vectors. In an example, the processing logic generates the fourth vector map by projecting a direction component of each vector in the third set of vectors to a radial direction.

At block 410, the processing logic generates a fifth vector map including a fifth set of vectors. The fifth vector map may be a radial map (e.g., radial map 164) and will be referred to as a radial map, hereafter. In an example, the processing logic may group the vectors of the fourth set of vectors and determine an average magnitude associated with each group (or radius) of vectors. The direction of the vectors may remain unchanged. The radial map may indicate stresses and/or strains exhibited across the substrate. In particular, on each group in the radial map, all the vectors may have the same magnitude (e.g., a radial vector), and be directed either towards the center or away from the center. A direction towards the center man indicate that stress and/or strains in that group are compressive, which may indicate that energy density is high. A direction away from the center may indicate tensile local stress and/or strains, which may indicate that the energy density is relatively lower. In an example, since each radial vector may be bi-directional, the processing logic may assign positive and negative signs to each radial vector based on the direction of the radial vector. For example, a positive sign may be assigned to radial vectors having a direction towards the center (which indicates compressive stress), and a negative sign may be assigned to radial vectors having a direction away from the center (which indicates tensile stress). In another example, each radial vector may be assigned a color based on its direction and magnitude. In yet another example, any combination of signs and colors can be used to indicate stresses and/or magnitudes on the fifth vector map. The processing logic may generate a three-sigma value for the x-axis component and for the y-axis component of the radial map.

FIG. 5D is a graph showing an example radial map. The three-sigma value for the x-axis of the graph in FIG. 5D is 5.3 nm and the three-sigma value for the y-axis component is 5.3 nm. As seen, the radial map displays multiples groups including a radial vector. Different shades are associated with each group (or radius), and the shade indicates whether the group is compressive (and at what magnitude) or whether the group is tensile (and at what magnitude).

The direction and the three-sigma value for the radial map may allow a user or the analysis component 108 to gauge the what effect the manufacturing process and hardware parts of the manufacturing equipment have on radial IPD of the substrate. The analysis component 108 may generate a recommendation based on the radial map. In an example, the analysis component 108 may recommend a design optimization, a manufacturing part replacement, and/or a manufacturing process adjustment to minimize the radial component (e.g., minimize stresses and/or strains experienced by the substrate). In another example, the analysis component 108 may automatically perform a corrective action based on the planar map.

Returning to FIG. 4, at block 412, the processing logic generates a sixth vector map including a sixth set of vectors. The sixth vector map may be a residue map (e.g., residue map 164) and will be referred to as a residue map, hereafter. The processing logic may generate the residue map by subtracting each vector in the fifth set of vectors from a corresponding vector in the first set of vectors. The processing logic may generate a three-sigma value for the x-axis component and for the y-axis component of the radial map. The sixth set of vectors on the residue map may be scattered in direction and magnitude. A high magnitude in a location in the residue map may indicate a hardware failure, a process non-stability, or any other hardware or manufacturing processes that cause localized defects. For example, a pattern may emerge in a particular location, which may indicate a hardware design flaw. In response, the analysis component 108 may issue a recommendation to change a hardware component, or recommend generating a new design to improve process stability.

FIG. 5E is a graph showing an example residue map. The three-sigma value for the x-axis of the residue map in FIG. 5D is 0.7 nm and the three-sigma value for the y-axis component is 1.2 nm. As seen, the residue map displays small magnitude values and small sigma three-values, which may indicate that the no local abnormalities in the IPD map.

The analysis component 108 may generate a recommendation, using the correlation database 168, based on the residue map. In an example, the analysis component 108 may recommend a design optimization, a manufacturing part replacement, and/or a manufacturing process adjustment to minimize or eliminate residue component. In another example, the analysis component 108 may automatically perform a corrective action based on the residue map.

Figure 6:
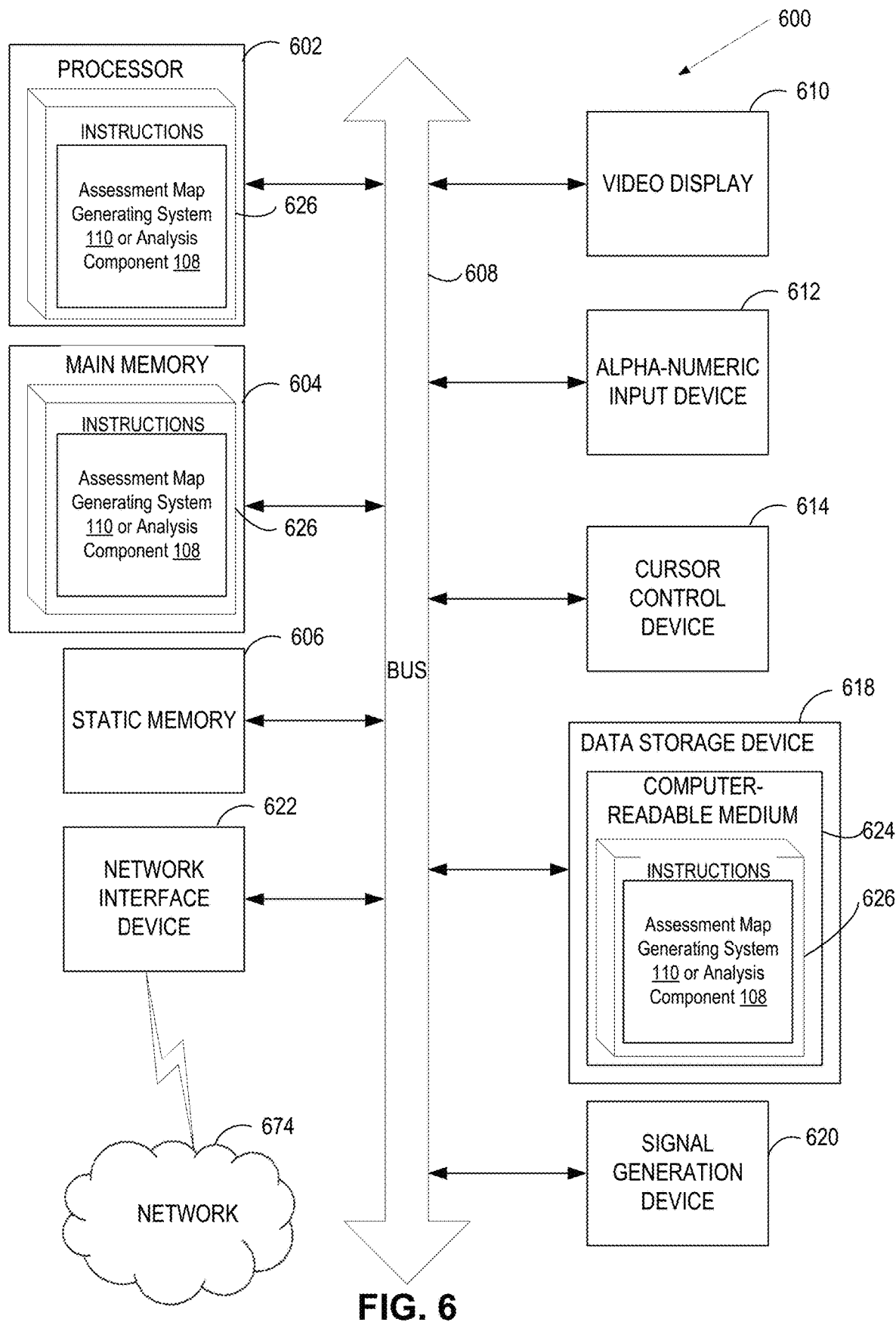
FIG. 6 is a block diagram illustrating a computer system, according to certain embodiments.

FIG. 6 is a block diagram illustrating a computer system 600, according to certain embodiments. In some embodiments, computer system 600 may be connected (e.g., via a network, such as a Local Area Network (LAN), an intranet, an extranet, or the Internet) to other computer systems. Computer system 600 may operate in the capacity of a server or a client computer in a client-server environment, or as a peer computer in a peer-to-peer or distributed network environment. Computer system 600 may be provided by a personal computer (PC), a tablet PC, a set-top box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 600 may include a processing device 602, a volatile memory 604 (e.g., random access memory (RAM)), a non-volatile memory 606 (e.g., read-only memory (ROM) or electrically-erasable programmable ROM (EEPROM)), and a data storage device 616, which may communicate with each other via a bus 608.

Processing device 602 may be provided by one or more processors such as a general purpose processor (such as, for example, a complex instruction set computing (CISC) microprocessor, a reduced instruction set computing (RISC) microprocessor, a very long instruction word (VLIW) microprocessor, a microprocessor implementing other types of instruction sets, or a microprocessor implementing a combination of types of instruction sets) or a specialized processor (such as, for example, an application specific integrated circuit (ASIC), a field programmable gate array (FPGA), a digital signal processor (DSP), or a network processor).

Computer system 600 may further include a network interface device 622. Computer system 600 also may include a video display unit 610 (e.g., an LCD), an alphanumeric input device 612 (e.g., a keyboard), a cursor control device 614 (e.g., a mouse), and a signal generation device 620.

In some implementations, data storage device 616 may include a non-transitory computer-readable storage medium 624 on which may store instructions 626 encoding any one or more of the methods or functions described herein, including instructions encoding components of FIG. 1 (e.g., assessment map generating system 110, analysis component 108, etc.) and for implementing methods described herein.

Instructions 626 may also reside, completely or partially, within volatile memory 604 and/or within processing device 602 during execution thereof by computer system 600, hence, volatile memory 604 and processing device 602 may also constitute machine-readable storage media.

While computer-readable storage medium 624 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The methods, components, and features described herein may be implemented by discrete hardware components or may be integrated in the functionality of other hardware components such as ASICS, FPGAs, DSPs or similar devices. In addition, the methods, components, and features may be implemented by firmware modules or functional circuitry within hardware devices. Further, the methods, components, and features may be implemented in any combination of hardware devices and computer program components, or in computer programs.

Unless specifically stated otherwise, terms such as "receiving," "determining," "generating," "storing," "causing," "training," "interrupting," "selecting," "providing," "displaying," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and may not have an ordinal meaning according to their numerical designation.

Examples described herein also relate to an apparatus for performing the methods described herein. This apparatus may be specially constructed for performing the methods described herein, or it may include a general purpose computer system selectively programmed by a computer program stored in the computer system. Such a computer program may be stored in a computer-readable tangible storage medium.

The methods and illustrative examples described herein are not inherently related to any particular computer or other apparatus. Various general purpose systems may be used in accordance with the teachings described herein, or it may prove convenient to construct more specialized apparatus to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A system comprising:
   a memory; and
   a processing device, coupled to the memory, to:
   receive a first vector map associated with manufacturing parameters of a substrate, wherein the first vector map comprises a first set of vectors each indicating a distortion of a particular location of a plurality of locations on the substrate;
   generate a second vector map comprising a second set of vectors by rotating a position of each vector in the first set of vectors, the second set of vectors each indicating a change in direction of a magnitude of the distortion of the particular location on the substrate;
   generate a third vector map comprising a third set of vectors based on a computation of vectors in the second set of vectors and corresponding vectors in the first set of vectors, the third set of vectors reflecting reduced noise in distortions across the plurality of locations on the substrate; and
   generate a fourth vector map by subtracting each vector of the third set of vectors from a corresponding vector in the first set of vectors, wherein the fourth vector map indicates a planar component of the first vector map, indicative of a direction of a sloping effect produced by stacked film on the substrate, of the first vector map.

2. The system of claim 1, wherein the first vector map comprises an in-plane distortion map.

3. The system of claim 1, wherein the processing device is further to:
   generate a three-sigma value for an x-axis component of the fourth vector map; and
   generate a three-sigma value for a y-axis component of the fourth vector map.

4. The system of claim 1, wherein the processing device is further to:
   recommend a corrective action based on the fourth vector map.

5. The system of claim 1, wherein the processing device is further to:
   automatically perform a corrective action based on the fourth vector map.

6. A method comprising:
   receiving a first vector map associated with manufacturing parameters of a substrate, wherein the first vector map comprises a first set of vectors each indicating a distortion of a particular location of a plurality of locations on the substrate;
   generating a second vector map comprising a second set of vectors by rotating a position of each vector in the first set of vectors, the second set of vectors each indicating a change in direction of a magnitude of the distortion of the particular location on the substrate;
   generating a third vector map comprising a third set of vectors based on a computation of vectors in the second set of vectors and corresponding vectors in the first set of vectors, the third set of vectors reflecting reduced noise in distortions across the plurality of locations on the substrate; and
   generating a fourth vector map by subtracting each vector of the third set of vectors from a corresponding vector in the first set of vectors, wherein the fourth vector map indicates a planar component, indicative of a direction of a sloping effect produced by stacked film on the substrate, of the first vector map.

7. The method of claim 6, wherein the first vector map comprises an in-plane distortion map.

8. The method of claim 6, further comprising:
   generating a three-sigma value for an x-axis component of the fourth vector map; and
   generating a three-sigma value for a y-axis component of the fourth vector map.

9. The method of claim 6, further comprising:
   recommending a corrective action based on the fourth vector map.

10. The method of claim 6, further comprising:
    automatically performing a corrective action based on the fourth vector map.

11. A non-transitory computer-readable storage medium comprising instructions that, when executed by a processing device operatively coupled to a memory, performs operations comprising:
    receiving a first vector map associated with manufacturing parameters of a substrate, wherein the first vector map comprises a first set of vectors each indicating a distortion of a particular location of a plurality of locations on the substrate;

generating a second vector map comprising a second set of vectors by rotating a position of each vector in the first set of vectors, the second set of vectors each indicating a change in direction of a magnitude of the distortion of the particular location on the substrate;

generating a third vector map comprising a third set of vectors based on a computation of vectors in the second set of vectors and corresponding vectors in the first set of vectors, the third set of vectors reflecting reduced noise in distortions across the plurality of locations on the substrate; and generating a fourth vector map by subtracting each vector of the third set of vectors from a corresponding vector in the first set of vectors, wherein the fourth vector map indicates a planar component of the first vector map, indicative of a direction of a sloping effect produced by stacked film on the substrate, of the first vector map.

12. The non-transitory computer-readable storage medium of claim 11, wherein the first vector map comprises an in-plane distortion map.

13. The non-transitory computer-readable storage medium of claim 11, wherein the operations further comprise:
generating a three-sigma value for an x-axis component of the fourth vector map; and
generating a three-sigma value for a y-axis component of the fourth vector map.

14. The non-transitory computer-readable storage medium of claim 11, wherein the operations further comprise:
recommending a corrective action based on the fourth vector map.

15. The non-transitory computer-readable storage medium of claim 11, wherein the operations further comprise:
automatically performing a corrective action based on the fourth vector map.

* * * * *